(12) United States Patent
Kondou et al.

(10) Patent No.: US 7,535,076 B2
(45) Date of Patent: May 19, 2009

(54) POWER SEMICONDUCTOR DEVICE

(75) Inventors: Makoto Kondou, Fukuoka (JP); Kiyoshi Arai, Tokyo (JP); Jose Saiz, Aureilhan (FR); Pierre Solomalala, Aureilhan (FR); Emmanuel Dutarde, Laloubere (FR); Benoit Boursat, Bizanos (FR); Philippe Lasserre, Ousse (FR)

(73) Assignee: Alstom Transport SA, Levallois-Perret (FR)

( * ) Notice: Subject to any disclaimer, the term of this patent is extended or adjusted under 35 U.S.C. 154(b) by 379 days.

(21) Appl. No.: 11/029,379

(22) Filed: Jan. 6, 2005

(65) Prior Publication Data
US 2005/0146027 A1 Jul. 7, 2005

(30) Foreign Application Priority Data
Jan. 7, 2004 (JP) ............................. 2004-001848

(51) Int. Cl.
| H01L 29/00 | (2006.01) |
| H01L 29/76 | (2006.01) |
| H01L 29/94 | (2006.01) |
| H01L 31/062 | (2006.01) |
| H01L 23/34 | (2006.01) |
| H01L 23/50 | (2006.01) |

(52) U.S. Cl. ..................... 257/502; 257/341; 257/723; 257/401; 257/342; 257/343; 257/E23.079

(58) Field of Classification Search ......... 257/341–343, 257/401, 502, 723, E23.079
See application file for complete search history.

(56) References Cited

U.S. PATENT DOCUMENTS

| 4,646,129 A | * | 2/1987 | Yerman et al. ............... 257/704 |
| 5,559,374 A | * | 9/1996 | Ohta et al. .................. 257/723 |
| 5,786,636 A | | 7/1998 | Takahashi |
| 5,945,730 A | | 8/1999 | Sicard et al. |
| 6,072,240 A | * | 6/2000 | Kimura et al. ............... 257/735 |
| 6,144,101 A | * | 11/2000 | Akram ....................... 257/778 |

(Continued)

FOREIGN PATENT DOCUMENTS

FR 2 814 907 4/2002

(Continued)

OTHER PUBLICATIONS

Search Report from the French Patent Office dated Oct. 26, 2006.

*Primary Examiner*—Luan C Thai
(74) *Attorney, Agent, or Firm*—McDermott Will & Emery LLP (57) ABSTRACT

The present invention relates to a power semiconductor device comprising a switching power semiconductor element, and a free wheeling diode in anti-parallel connection to the switching power semiconductor element. The power semiconductor is characterized in that a reverse electrode of the switching power semiconductor element and a reverse electrode of the free wheeling diode are bonded and mounted on a circuit pattern formed on the main surface of the first substrate, and that a circuit pattern, which is so formed on the main surface of the second substrate as to oppose a surface electrode of the switching power semiconductor element and a surface electrode of the free wheeling diode, is connected to the surface electrodes of the switching power semiconductor element and the free wheeling diode through connective conductors to be soldered, respectively.

7 Claims, 13 Drawing Sheets

U.S. PATENT DOCUMENTS

| | | | |
|---|---|---|---|
| 6,274,451 B1 | 8/2001 | Changey et al. | |
| 6,278,179 B1 | 8/2001 | Mermet-Guyennet | |
| 6,297,079 B1 | 10/2001 | Changey et al. | |
| 6,306,680 B1 * | 10/2001 | Fillion et al. | 438/106 |
| 6,324,072 B1 * | 11/2001 | Lorenz et al. | 361/803 |
| 6,344,686 B1 | 2/2002 | Schaeffer et al. | |
| 6,350,954 B1 * | 2/2002 | Specks et al. | 174/551 |
| 6,589,859 B2 | 7/2003 | Petitbon et al. | |
| 6,703,707 B1 * | 3/2004 | Mamitsu et al. | 257/718 |
| 2002/0006685 A1 | 1/2002 | Petitbon et al. | |
| 2003/0106924 A1 | 6/2003 | Nobori et al. | |

FOREIGN PATENT DOCUMENTS

| | | |
|---|---|---|
| GB | 2 334 143 | 8/1999 |
| JP | 62-72147 | 4/1987 |
| JP | 6-302734 | 10/1994 |
| JP | 8-8395 | 1/1996 |
| JP | 8-17972 | 1/1996 |
| JP | 9-283887 | 10/1997 |
| JP | 10-56131 | 2/1998 |
| JP | 10-233509 | 9/1998 |
| JP | 1 104 024 A2 | 5/2001 |
| JP | 2001-291823 | 10/2001 |
| JP | 2002-16215 | 1/2002 |
| JP | 2002-76254 | 3/2002 |
| JP | 2003-243608 | 8/2003 |
| JP | 102 58 565 B3 | 8/2004 |

* cited by examiner

Fig. 13  *Prior Art*

POWER SEMICONDUCTOR DEVICE

CROSS-REFERENCE TO RELATED APPLICATION

The present application claims the benefit of patent applications No. 2004-1848 filed in Japan on Jan. 7, 2004, the subject matter of which is hereby incorporated herein by reference.

BACKGROUND OF THE INVENTION

1. Field of the Invention

The present invention relates to a power semiconductor device.

2. Description of the Related Art

Figure 13:
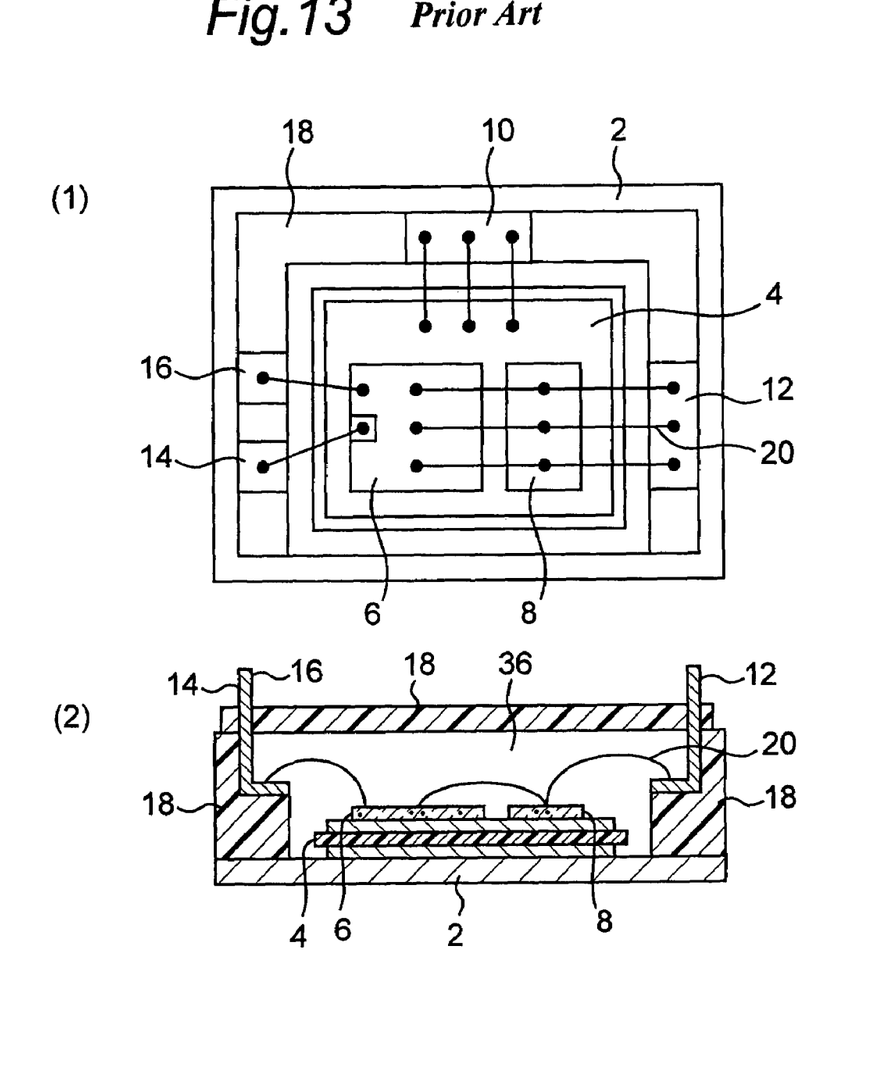
FIG. 13 shows a conventional power semiconductor device according to the prior art.

One of conventional power semiconductor devices is shown in FIG. 13.

Disposed on the metallic base board (2) is an insulating substrate (4) of ceramics having metal-plated circuit patterns on both sides, and mounted on the insulating substrate (4) are a switching power semiconductor element (6) such as IGBT, MOSFET or the like and a free wheeling diode (8). The switching power semiconductor element (6) and the free wheeling diode (8) are connected to a casing (18) having external terminals built therein (an insert casing), through the external terminals. The switching power semiconductor element (6) such as IGBT is so disposed that the upper side (surface) thereof serves as an emitter face and the lower side (reverse) thereof, as a collector face. The free wheeling diode (8) is so disposed that the upper side (surface) thereof serves as an anode face, and the lower side (reverse) thereof, as a cathode face. The circuit as a whole comprises a pattern formed on the insulating substrate (4) and wires (20), and is connected to the casing (18). Gel (or a resin, or gel and a resin) (36) is inserted into the casing (18) so as to protect the element and the circuit, and the casing (18) is covered with a lid.

In this power semiconductor device, the connection of the emitter face of the switching power semiconductor element (6) is made through the wires (20), and this connection method arises the following problems.

Firstly, there is a limit in the capacity of a current since the wire (20) is thin. In practical use, a required capacity of current is ensured for a main circuit by using thicker wires, or increasing the number of wires (20). However, this method requires spaces for wire bonding, and therefore has a limit in miniaturization of the elements and the device. Secondly, the circuit resistance becomes larger because of the use of the thin wires (20). While this problem also can be solved by using thicker wires or increasing the number of the wires (20), there are limits as mentioned above. Thirdly, heat is locally accumulated, since a current is concentrated on the joints of the wires on the switching power semiconductor element (6). While the concentration of heat is reduced by decentralizing the joints of the wires on the element, heat is not completely decentralized. Fourthly, the gate may oscillate when a short circuit occurs in the semiconductor device. In the power semiconductor device, a wire (20) is bonded to each of the emitter cells of the switching power semiconductor element (6), and the cells are connected to one another through the pattern formed on the insulating substrate (4) to which the wires (20) are bonded. Such connection causes unbalance between each of the cells, and thus, the gate oscillates when a short circuit occurs in the semiconductor device. As a result, the device may be destructed or may cause malfunction. It may be possible to solve this problem by direct stitch connection of each of the cells through the wires. However, the number of operations for wire bonding is increased, and the area of the device for such wire bonding is also increased. As a result, there still remain similar limits to the first problem. Fifthly, spaces for bonding the wires are needed.

The foregoing are main problems in relation to the wires (20). There are further problems in relation to heat radiation. In the conventional semiconductor device, heat radiation is carried out by applying grease to the reverse side of the base board and screwing heat radiation fins. In this case, only one side of the device is used for heat radiation.

JP-A-10-56131 discloses a technique in which connection of main electrodes is made through a plurality of bumps in a IGBT module having circuit patterns on the upper and lower sides thereof. JP-A-8-8395 discloses a technique in which an element analogous to the connective conductor is used. JP-A-10-233509 describes an example of a device having a plurality of bumps provided therein. JP-A-6-302734 discloses a technique in which two substrates are connected to each other through a spring. JP-A-8-17972 discloses a technique for embedding poles and metal balls in bumps for use in connection of a package mother board. JP-A-2002-16215 and JP-A-2002-76254 disclose IPMs each of which uses two lead frames, i.e. upper and lower lead frames.

SUMMARY OF THE INVENTION

Therefore, an object of the present invention is to provide a power semiconductor device improved as follows: the current capacity of the main circuit is improved, and the circuit resistance is decreased; heat can be decentralized on the element; and the oscillation of gate due to the unbalance of emitter cells can be prevented.

The present invention is developed in order to achieve the above object. A power semiconductor device according to a preferred embodiment of the present invention comprises a switching power semiconductor element, and a free wheeling diode in antiparallel connection to the switching power semiconductor element, and this power semiconductor device is characterized in that a reverse electrode of the switching power semiconductor element and a reverse electrode of the free wheeling diode are bonded and mounted on a circuit pattern formed on a main surface of the first substrate; and that a circuit pattern, which is so formed on a main surface of the second substrate as to oppose a surface electrode of the switching power semiconductor element and a surface electrode of the free wheeling diode, is connected to the surface electrodes of the switching power semiconductor element and the free wheeling diode through connective conductors to be soldered, respectively.

According to the present invention, the current capacity of the main circuit can be greatly improved, and the circuit resistance can be decreased. In addition, heat can be decentralized on the element; the oscillation of the gate due to the unbalance of the emitter cells is effectively prevented; and the miniaturization of the device becomes possible. Further, heat radiation from the upper side and the lower side of the power semiconductor device also becomes possible.

DETAILED DESCRIPTION OF THE PREFERRED EMBODIMENTS

Hereinafter, preferred embodiments according to the present invention will be illustrated with reference to the accompanying drawings.

Embodiment 1

Figure 1:
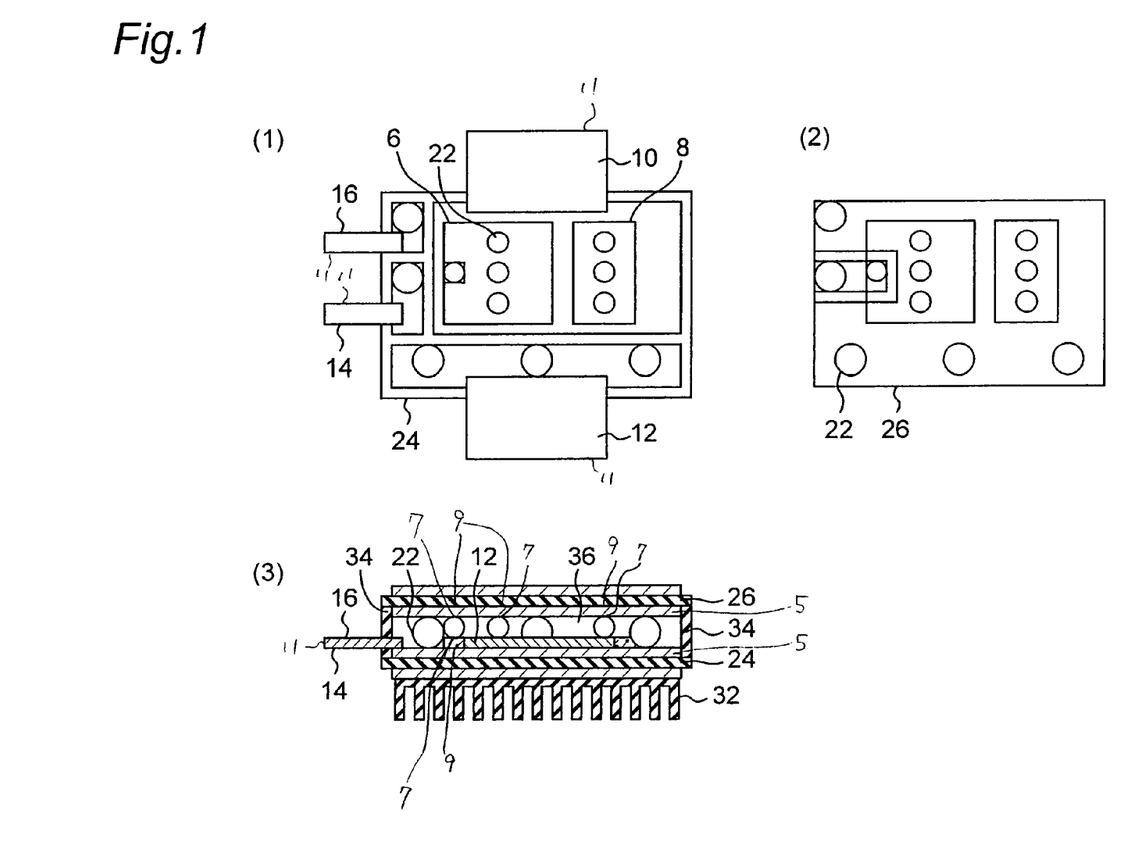
FIG. 1 shows a power semiconductor device according to the first embodiment of the present invention.

FIG. 1, consisting of FIGS. 1(1) to 1(3), shows a power semiconductor device according to Embodiment 1 of the present invention. FIG. 1(1) shows a top plan view of a first substrate described below; FIG. 1(2), a bottom view of a second substrate described below; and FIG. 1(3), a longitudinal sectional view of the power semiconductor device. In this power semiconductor device, a switching power semiconductor element (6) and a free wheeling diode (8) are mounted on the first substrate (24). The emitter face of the switching power semiconductor element (6) and the anode face of the free wheeling diode (8) are connected to the second substrate (26) which is an insulating substrate having a circuit pattern formed thereon, through connective conductors (22) (balls as seen in Figure). Herein, the switching power semiconductor element (6) is a semiconductor such as IGBT, MOSFET or the like. The switching power semiconductor element (6) and the free wheeling diode (8) have reverse electrodes 9 and surface electrodes 7, respectively. The first and second substrates (24, 26) have circuit patterns 5, respectively. In FIG. 1(1), reference numerals (10, 12) indicate main current terminals, and reference numerals (14) and (16) indicate a signal terminal (gate) and a signal terminal (emitter), respectively. The main current terminals (10, 12) and the signal terminals (14, 16) are also indicated as external terminals (11).

As shown in FIG. 1(3), a heat sink (32) as a heat radiation portion is bonded to the underside of the first substrate (24). The heat sink (32) may be bonded to the upper side of the second substrate. In case where some problem in strength arises because of the direct exposure of the insulating substrate to an external as seen in FIG. 1(3), a base board is provided on the underside of the device, or a part of the device is coated, or covered with a casing.

The connective conductors (22) and the components of the device may be connected by soldering, ultrasonic bonding or pressure welding. In Embodiment 1, all the components are mounted on the first substrate (24). This is advantageous, because difficulties in production can be avoided, so that the productivity is improved. The connective conductors (22) are allowed to have flexibility after the device is assembled, so that stresses applied to the connective conductors (22) can be absorbed.

Figure 6:
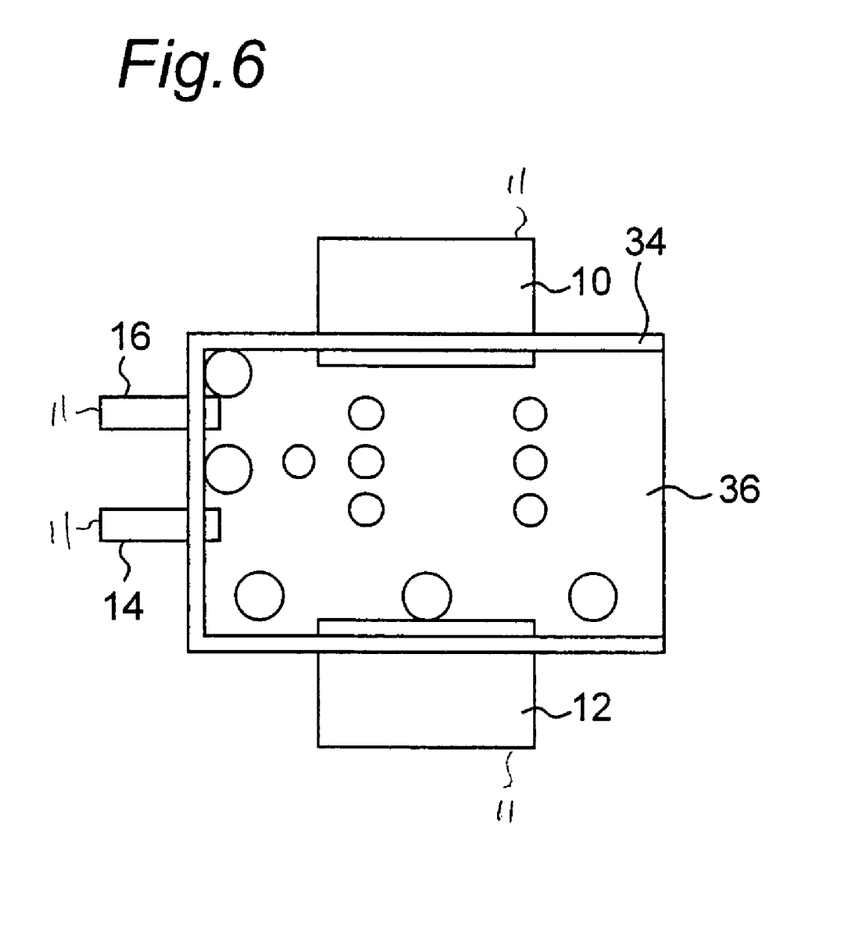
FIG. 6 shows a diagram illustrating the insertion of a gel-like insulating and heat resistant filler between the first substrate and the second substrate.

A gel-like, insulating and heat resistant filler (36) (not hatched for easy recognition of the drawing) is inserted between the first substrate (24) and the second substrate (26). As shown in FIG. 6, the three sides of the space between the first substrate (24) and the second substrate (26) is sealed with an adhesive or a partitioning member (34) so that the filler (36) can be inserted from an opening left to remain. The filler may be inserted from the bases of the three sides but not the opening, using a syringe or the like.

Embodiment 1 provides the following advantages. In general, the current capacity of a conductive material is in proportion to the sectional area thereof, and the electric resistance thereof is in inverse proportion to the sectional area thereof. To increase the current capacity of a circuit and to decrease the electric resistance thereof, the sectional area of the conductive material should be increased. However, the area of the emitter face is limited in the semiconductor element of the power semiconductor device, and thus, the sectional area of all the wires (=the sectional are of one wire X the number of wires) can not be unrestrictedly increased. In addition, such wire connection unavoidably requires dead spaces for allowing connecting operations. In this point of view, the use of the connective conductors (22) as in Embodiment 1 dispenses with such dead spaces. In this regard, the connection through wires was compared with the connection through connective conductors, provided that the wires and the connective conductors were made of the same material. Then, it is found that the latter case can have a sectional area substantially two or more times larger than that of the former case.

The first substrate (24) and the second substrate (26), opposed to each other, are connected to each other with a relatively short distance therebetween, and therefore, the electrical and thermal resistances become smaller in accordance with the distance. How much this distance can be decreased depends on the degree of necessity of insulation between the two substrates. In this embodiment, it is considered that this distance can be decreased to about 2 mm at a rated voltage of about 3.3 V because of the insertion of the insulating filler.

Wires are generally made of aluminum (Al) for the convenience of processing. On the other hand, the connective conductors (22) used in the first embodiment can be made without taking into account such processing convenience, and thus can be made of copper (Cu) which has higher electric and heat conductivities than Al.

As described above, since the insulating substrate having the circuit pattern formed thereon is connected through the connective conductors in Embodiment 1, the current capacity of the main circuit can be greatly improved, and the circuit resistance can be decreased. Further, the practical area for allowing the connection of the emitter cells are relatively large, and therefore, the emitter cells can be connected to the circuit pattern with a relatively short distance between them. Consequently, heat decentralization on the semiconductor element is improved, and the oscillation of the gate due to the unbalance of the emitter cells can be prevented. In addition, the spaces required for connecting the wires to the circuit pattern can be decreased, and thus, the area of the plane surfaces of a whole of the device can be decreased. The height of the device is not so increased in Embodiment 1, because the height of the wire is originally needed in the power semiconductor device.

Further, by mounting heat sinks on both the upper side and the lower side of the device, the heat radiation effect can be improved.

Embodiment 2

Figure 2:
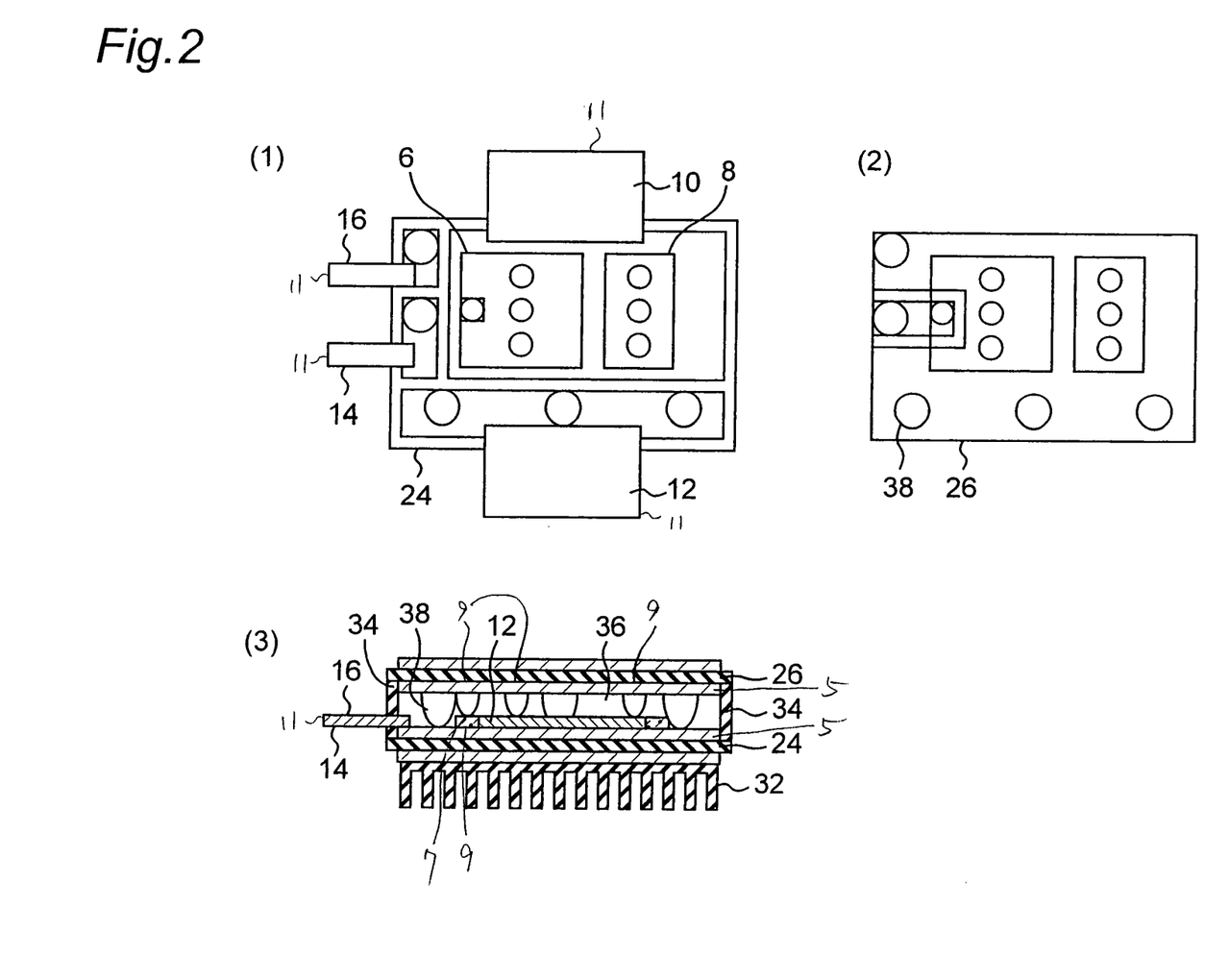
FIG. 2 shows a power semiconductor device according to the second embodiment of the present invention.

FIG. 2, consisting of FIGS. 2(1) to 2(3), shows a power semiconductor device according to Embodiment 2 of the present invention. Since the power semiconductor device according to the second embodiment is substantially the same as that according to the first embodiment, the description thereof is saved by denoting the like components with the like reference numerals, and thus, the difference of this embodiment is mainly described. FIG. 2(1) shows a top plan view of a first substrate; FIG. 2(2), a bottom view of a second substrate; and FIG. 2(3), a longitudinal sectional view of the device, as well as FIG. 1.

The power semiconductor device according to Embodiment 2 comprises, as the second substrate (26), an insulating substrate which has, thereon, a circuit pattern provided with connective projections (38) but not the connective conductors. The connective projections (38) are made of a conductive material, and are connected to the emitter face of the switching power semiconductor element (6) and the anode face of the free wheeling diode (8) on the first substrate (24).

Embodiment 2 provides the following advantages. In Embodiment 1, it is needed that the connective conductors are connected to both the semiconductor element and the insulating substrate having the circuit pattern formed thereon. Therefore, a larger number of steps are required, and it is anticipated that some difficulties may arise as the case may be. On the other hand, in Embodiment 2, the insulating substrate having, thereon, the circuit pattern provided with the connective projections is used to thereby save the production steps and also to improve the reliability of the power semiconductor device.

Embodiment 3

Figure 3:
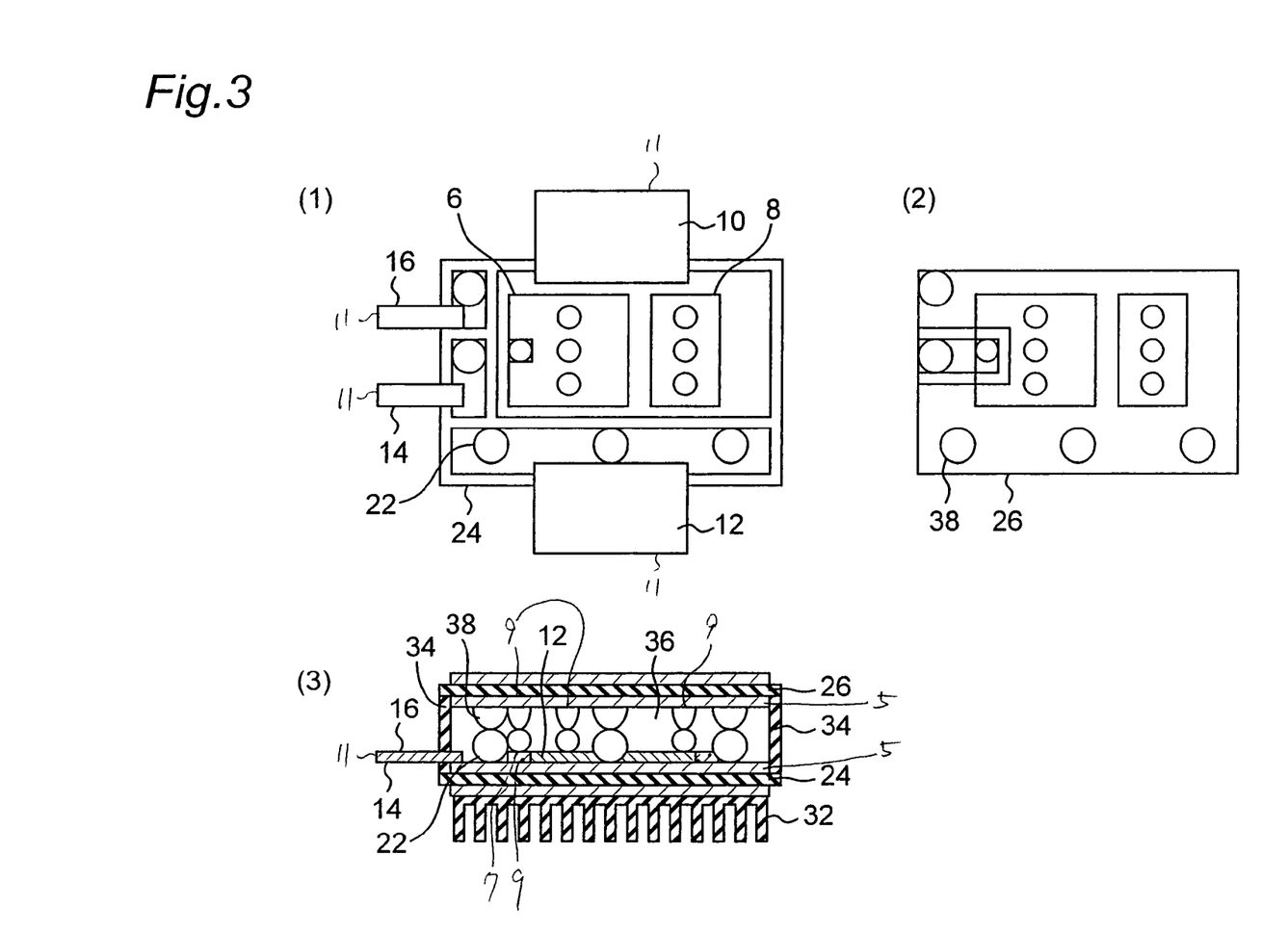
FIG. 3 shows a power semiconductor device according to the third embodiment of the present invention.

FIG. 3, consisting of FIGS. 3(1) to 3(3), shows a power semiconductor device according to Embodiment 3 of the present invention. Since the power semiconductor device according to Embodiment 3 is substantially the same as those according to Embodiment 1 and Embodiment 2, the description thereof is saved by denoting the like components with the like reference numerals, and thus, the difference of this embodiment is mainly described. FIG. 3(1) shows a top plan view of a first substrate; FIG. 3(2), a bottom view of a second substrate; and FIG. 3(3), a longitudinal sectional view of the device, as well as FIGS. 1 and 2.

The power semiconductor device according to Embodiment 3 shown in FIG. 3 comprises an insulating substrate which has, thereon, a circuit pattern provided with connective projections as in Embodiment 2 (i.e. a second substrate (26)), and also uses connective conductors (22). That is, the emitter face of the switching power semiconductor element (6) and the anode face of the free wheeling diode (8) on the first substrate (24) are connected to the circuit pattern formed on the insulating substrate as the second substrate (26) through the conductive projections (3) on the circuit pattern and the connective conductors (22).

In Embodiment 3, by concurrently using the connective projections and the connective conductors, the distance between the first substrate (24) and the second substrate (26) opposed to each other, and the area required for the connection of both the substrates can be independently adjusted. Therefore, an optimal designing for the device can be made, taking into account a current capacity, quantity of heat and stresses.

Embodiment 4

Figure 4:
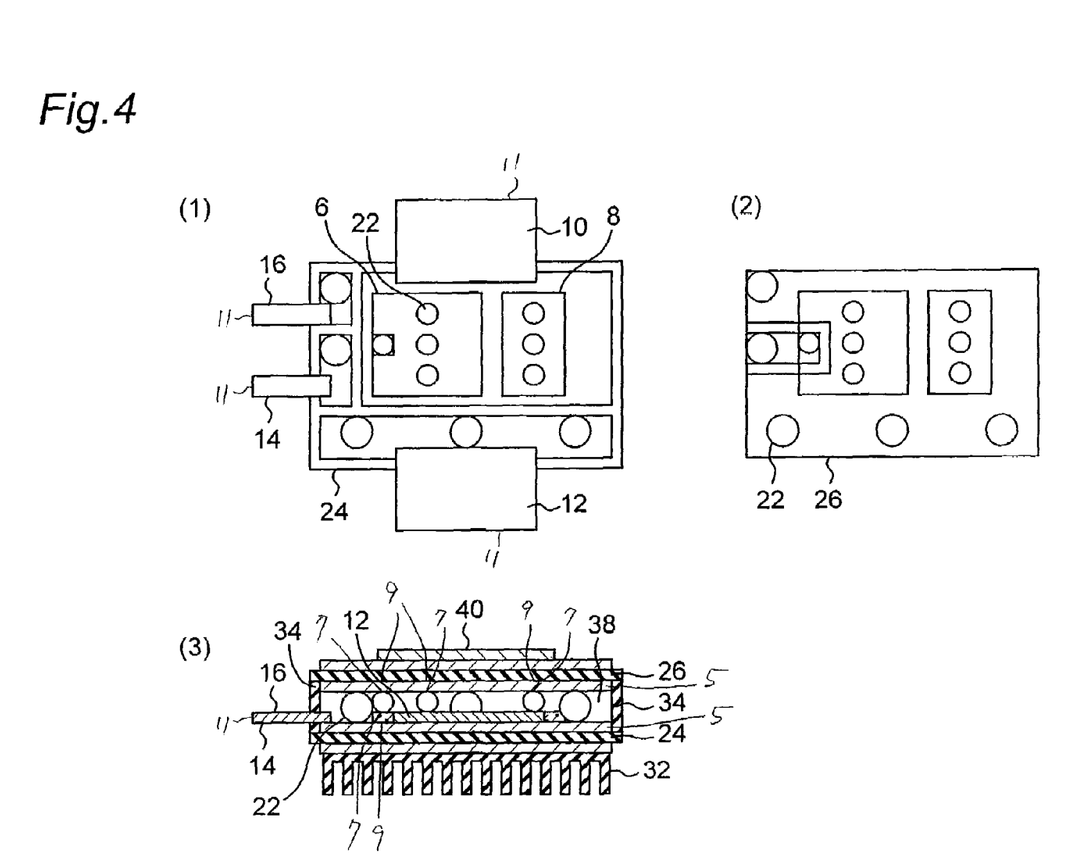
FIG. 4 shows a power semiconductor device according to the fourth embodiment of the present invention.

FIG. 4, consisting of FIGS. 4(1) to 4(3), shows a power semiconductor device according to Embodiment 4 of the present invention. Since the power semiconductor device according to Embodiment 4 is substantially the same as those according to Embodiment 1 to Embodiment 3, the description thereof is saved by denoting the like components with the like reference numerals, and thus, the difference of this embodiment is mainly described. FIG. 4(1) shows a top plan view of a first substrate; FIG. 4(2), a bottom view of a second substrate; and FIG. 4(3), a longitudinal sectional view of the device, as well as FIG. 1.

The power semiconductor device according to Embodiment 4 shown in FIG. 4 is in accordance with any of Embodiment 1 to Embodiment 3, except that a conductive portion is formed on a part of the second substrate (26) so as to electrically connect the surface and the reverse of the substrate to each other, and that a circuit pattern is formed on the reverse (or the outer surface) of the substrate. A control circuit (40) for controlling the driving of the switching power semiconductor element (6) is mounted on the circuit pattern formed on the reverse of the second substrate (26).

Arranged as above, a driving control unit can be directly mounted without the need of a separate printed board or the like. Therefore, the number of components is decreased, and the productivity is improved. Further, the inductance can be decreased by disposing the driving control unit in the vicinity of the switching power semiconductor element (6). As a result, more correct control becomes possible.

Embodiment 5

Figure 5:
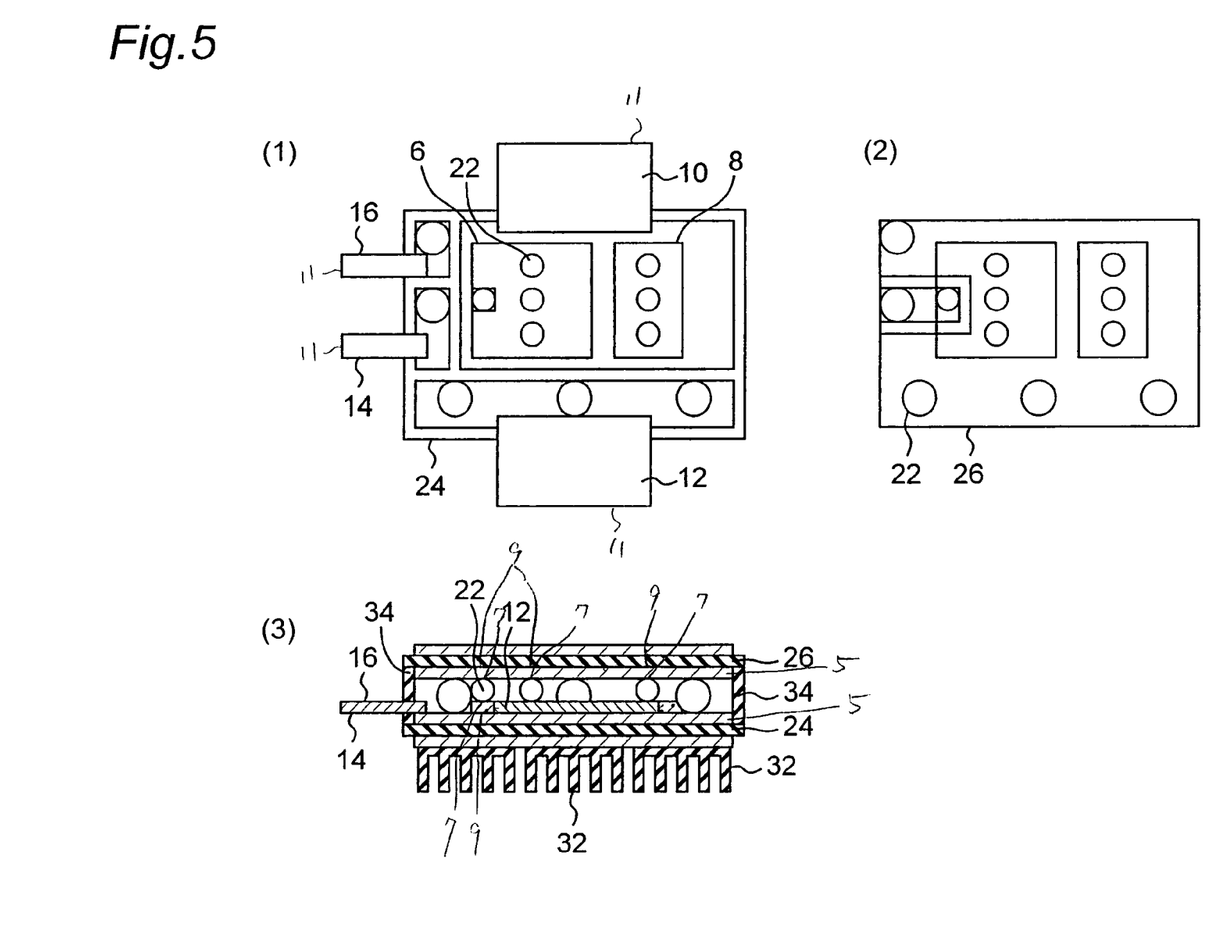
FIG. 5 shows a power semiconductor device according to the fifth embodiment of the present invention.

FIG. 5, consisting of FIGS. 5(1) to 5(3), shows a power semiconductor device according to Embodiment 5 of the present invention. Since the power semiconductor device according to Embodiment 5 is substantially the same as those according to Embodiment 1 to Embodiment 4, the description thereof is saved by denoting the like components with the like reference numerals, and thus, the difference of this embodiment is mainly described. FIG. 5(1) shows a top plan view of a first substrate; FIG. 5(2), a bottom view of a second substrate; and FIG. 5(3), a longitudinal sectional view of the device, as well as FIG. 1.

The power semiconductor device according to Embodiment 5 shown in FIG. 5 is in accordance with any of Embodiment 1 to Embodiment 4, except that at least the first substrate (24) is a ceramic insulating substrate, and that a heat sink (32) divided into a plurality of portions is bonded to the reverse of the ceramic insulating substrate.

Arranged as above, the heat radiation efficiency is improved, and the cracking of the ceramic substrate due to heating can be prevented, since the heat sink is divided into the plurality of portions to thereby deconcentrate a stress.

Otherwise, the heat sink divided as above may be formed integrally with the first substrate (24). By doing so, the productivity can be improved, and an increase in thermal resistance at the connections due to voids, cracks or the like can be prevented.

Embodiment 6

Figure 7:
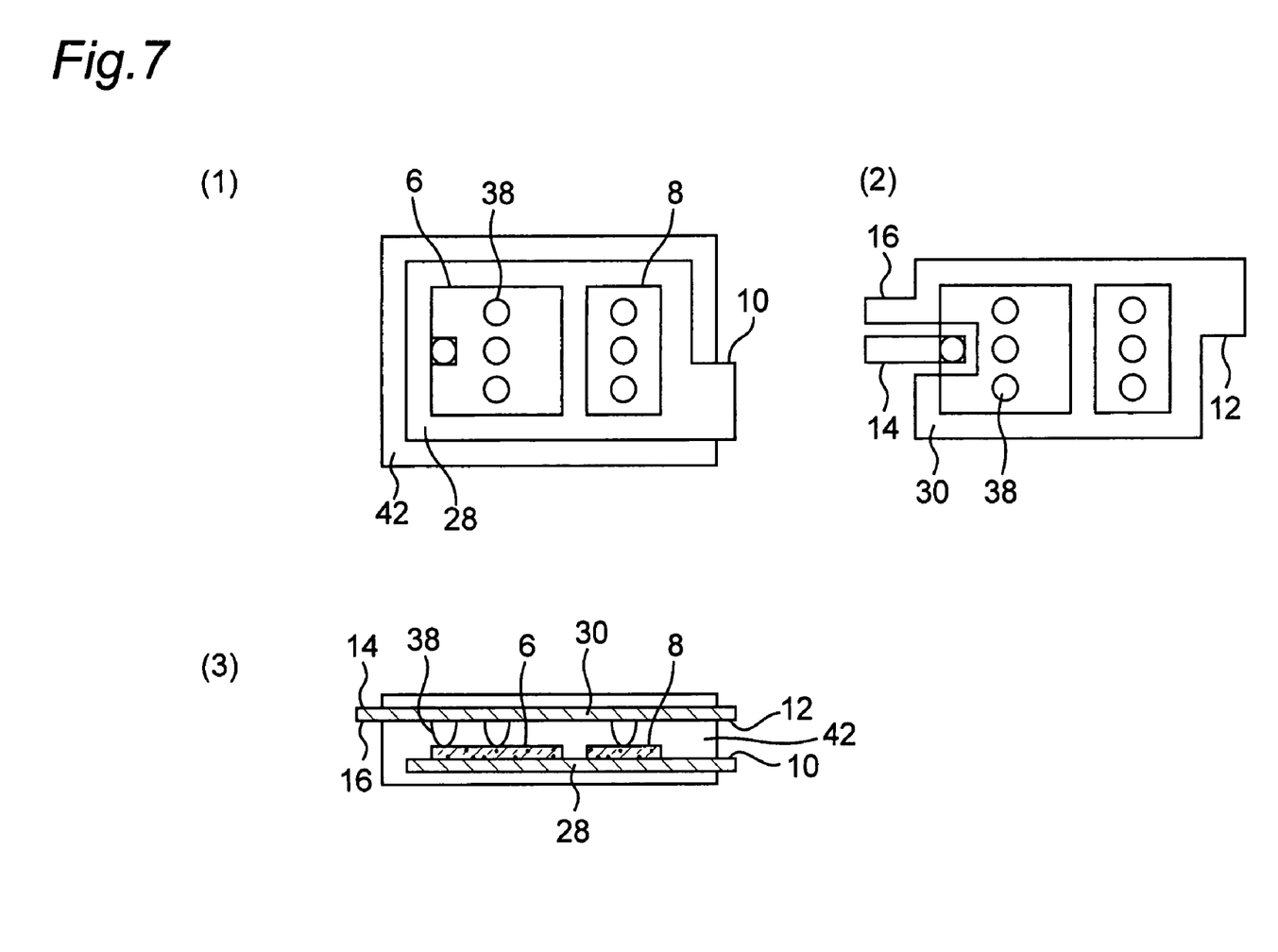
FIG. 7 shows a power semiconductor device according to the sixth embodiment of the present invention.
Figure 8:
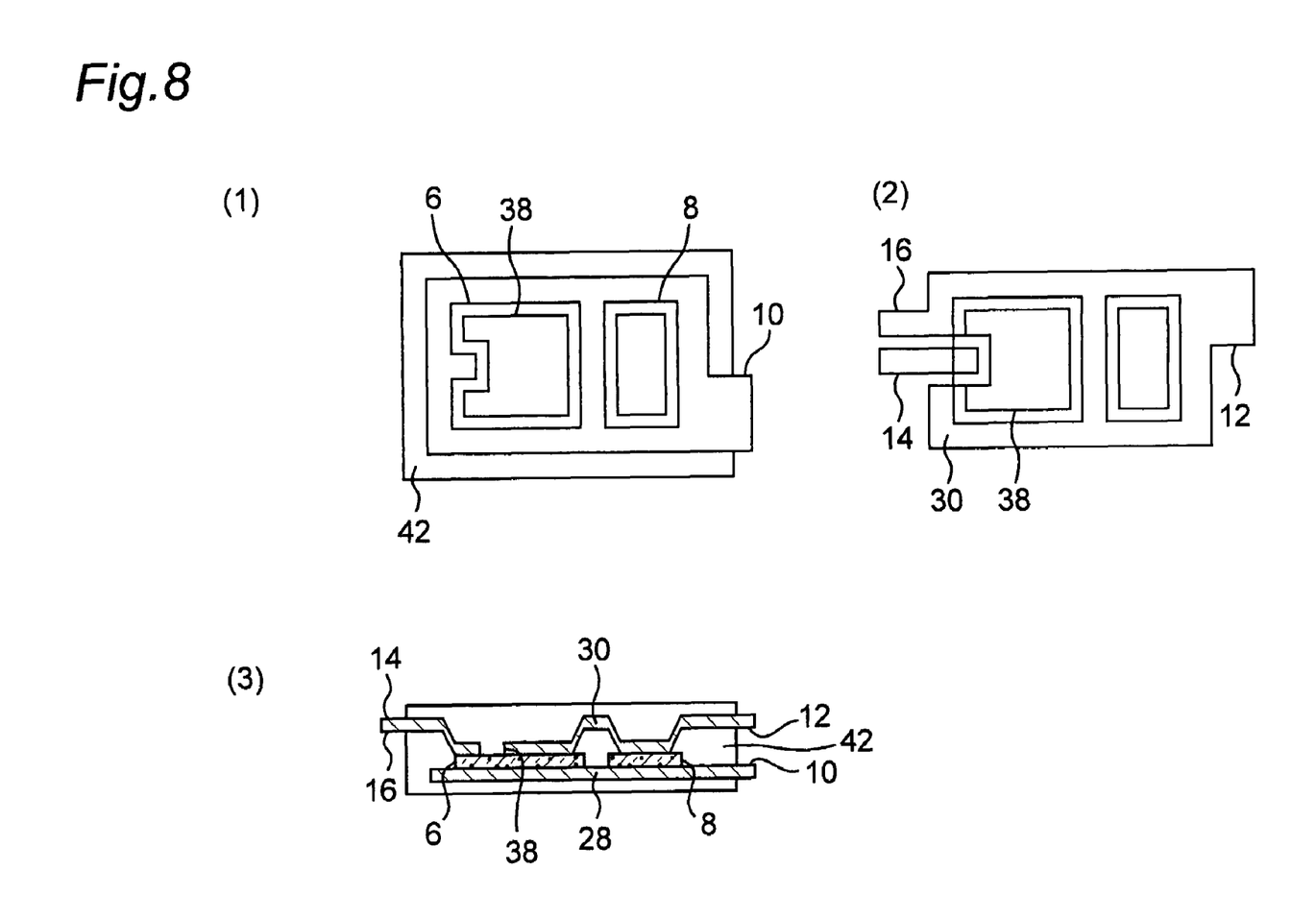
FIG. 8 shows another power semiconductor device according to the sixth embodiment of the present invention.

FIGS. 7 and 8 show power semiconductor devices according to Embodiment 6 of the present invention. FIG. 7(1) or 8(1) shows a top plan view of a first lead frame (described later); FIG. 7(2) or 8(2), a bottom view of a second lead frame (described later); and FIG. 7(3) or 8(3), a longitudinal sectional view of the device, as well as FIGS. 1 to 5.

Also, this power semiconductor device comprises a switching power semiconductor element (6), and a free wheeling diode (8) in anti-parallel connection to the switching power semiconductor element (6). However, both the components are mounted on the lead frame (the first lead frame (28)) but not on the insulating substrate. That is, a reverse electrode of the switching power semiconductor element (6) and a reverse electrode of the free wheeling diode (8) are bonded on the main surface of the first lead frame (28). Simultaneously, a surface electrode of the switching power semiconductor element (6) and a surface electrode of the free wheeling diode (8) are connected to projections (38) which are formed by projecting such parts of the surface of the second lead frame (30) that oppose the surface electrodes of the switching power semiconductor element (6) and the free wheeling diode (8). A whole of this structure is shaped by transfer-molding a resin.

As compared with the power semiconductor device according to Embodiment 1, the dielectric strength of the power semiconductor device according to Embodiment 6 is lower. However, this device can be produced at lower cost and in higher productivity, since the lead frames which are inexpensive and are easily shaped are used. Further, by making external terminals of the lead frames, the number of the components can be decreased, and thus, the productivity can be improved.

In the power semiconductor device shown in FIG. 7, a plurality of connective projections (38) are provided relative to one element, and thereby, wiring for the gate on the surface of the element can be avoided. Further, such a plurality of connective projections are intended to relax a stress. In the power semiconductor device shown in FIG. 8, the connective projections (38) are formed as having flat faces to thereby increase the connected area. By doing so, the concentration of current on the element can be prevented, and the heat radiation efficiency can be improved.

Embodiment 7

Figure 9:
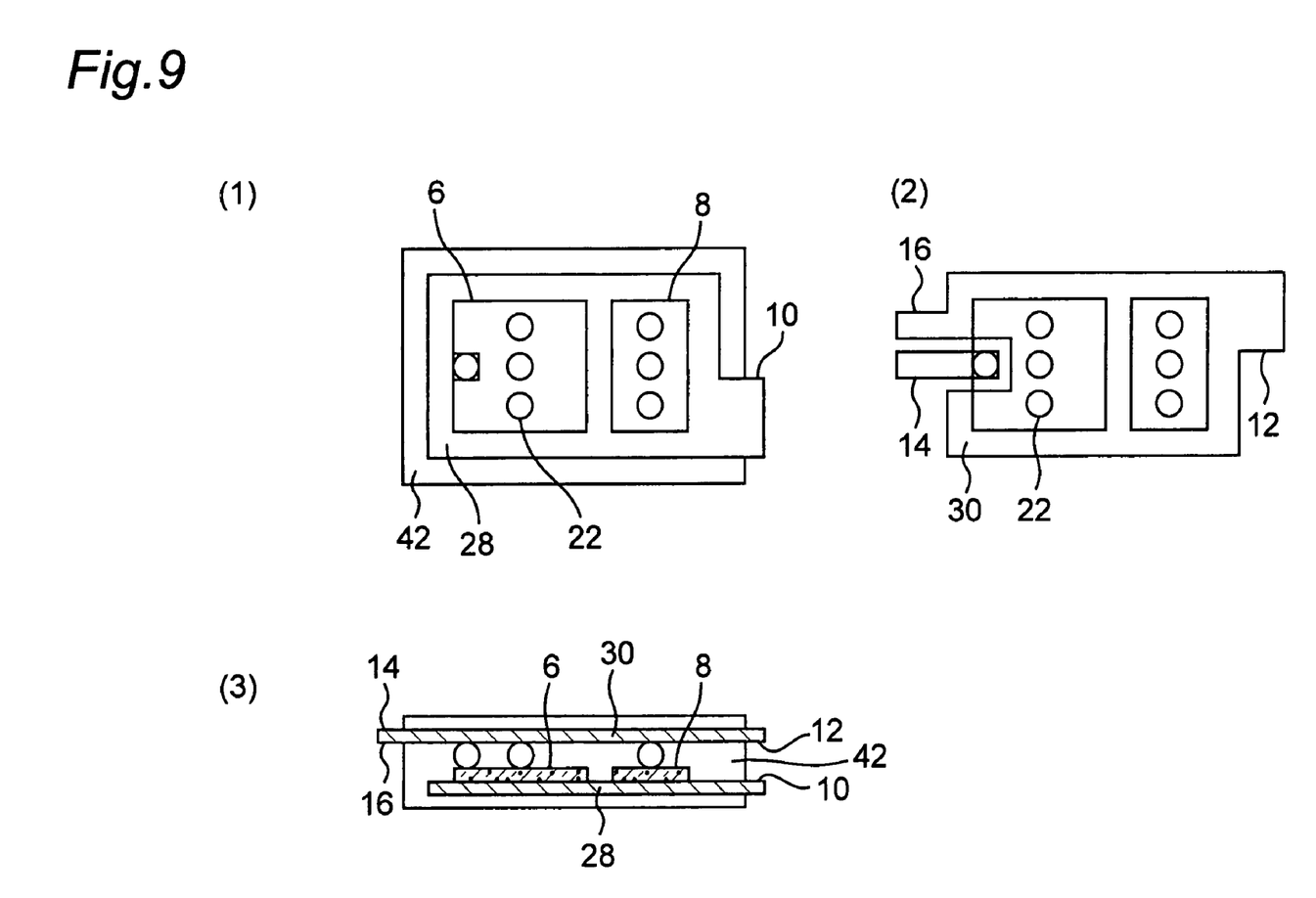
FIG. 9 shows a power semiconductor device according to the seventh embodiment of the present invention.

FIG. 9, consisting of FIGS. 9(1) to 9(3), shows a power semiconductor device according to Embodiment 7 of the present invention. Since the power semiconductor device according to Embodiment 7 is substantially the same as that according to Embodiment 6, the description thereof is saved by denoting the like components with the like reference numerals, and thus, the difference of this embodiment is mainly described. FIG. 9(1) shows a top plan view of a first lead frame; FIG. 9(2), a bottom view of a second lead frame; and FIG. 9(3), a longitudinal sectional view of the device, as well as FIGS. 7 and 8.

In the power semiconductor device according to Embodiment 7, both of the first lead frame (28) and the second lead frame (30) are shaped in the form of flat plates. A plurality of connective conductors (22) are soldered at predetermined positions on the main surface of the second lead frame (30) which opposes the first lead frame. The plurality of connective conductors are allowed to correspond to the surface electrode of the switching power semiconductor element (6) and the surface electrode of the free wheeling diode (8) and are soldered thereto. In other words, the upper and lower lead frames are connected through the connective conductors (22) but not connective projections.

As compared with Embodiment 6, the number of the components is increased in the power semiconductor device according to Embodiment 7, while the shape and material of the connective portions can be more freely selected, and therefore, the circuit resistance can be decreased, and the reliability of the device can be improved.

Figure 10:
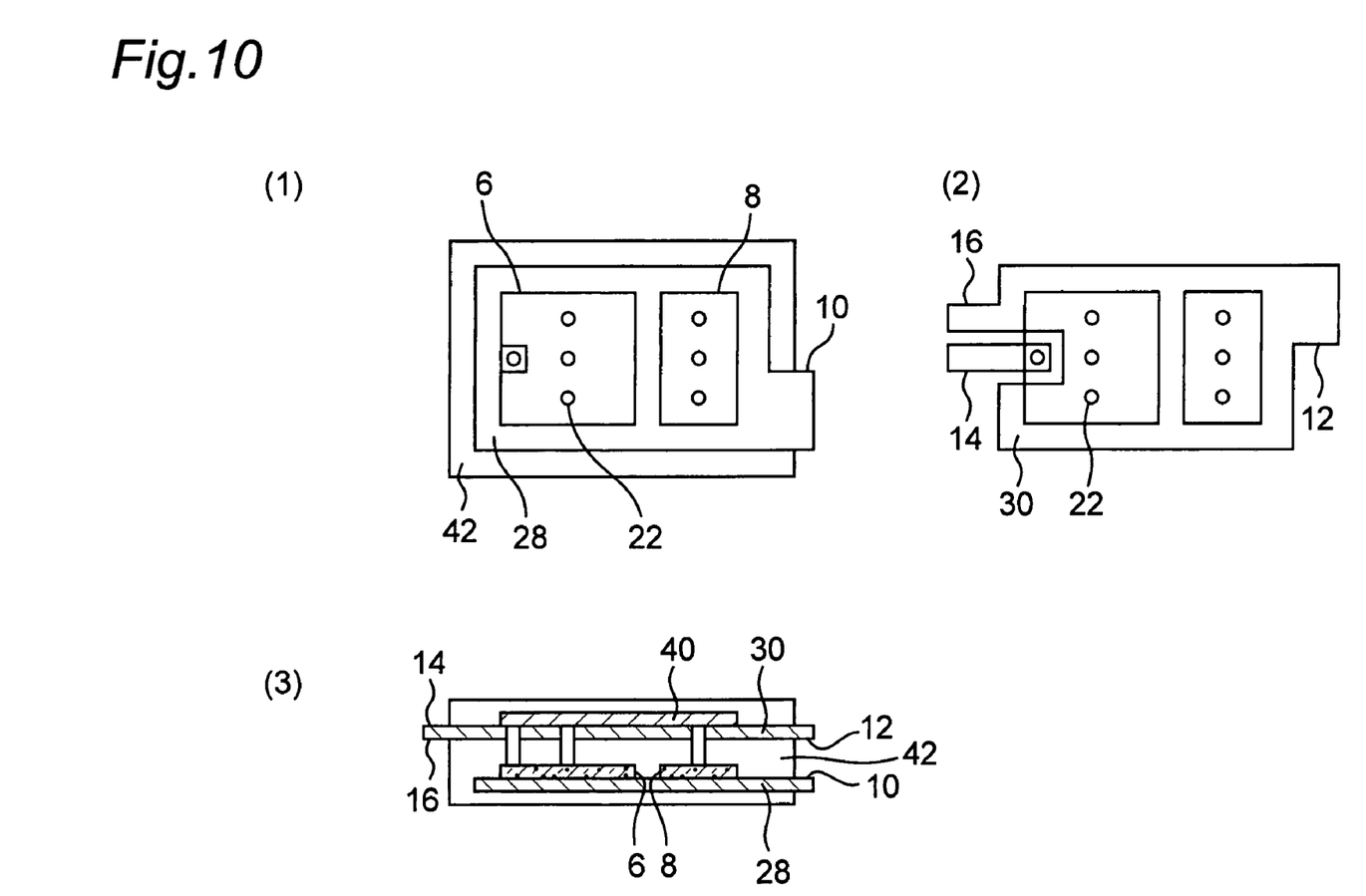
FIG. 10 shows another power semiconductor device according to the seventh embodiment of the present invention.

In the power semiconductor device according to Embodiment 7, a control circuit (40) for controlling the driving of the switching power semiconductor element (6) may be mounted on the reverse of the second lead frame (30), the main surface of which is opposed to the first lead frame (28), as shown in FIG. 10.

Further, a multi-layer printed board or a through hole board may be used in place of the second lead frame, and a control circuit for controlling the driving of the switching power semiconductor element (6) may be mounted on such a board.

By mounting the control circuit (40) as above, a driving control unit can be directly mounted without the need of a separate printed board. Thus, the number of the components can be decreased, and the productivity can be improved. Further, by disposing the driving control unit in the vicinity of the switching power semiconductor element, the inductance can be decreased, and thus, more correct controlling can be realized.

Embodiment 8

Figure 11:
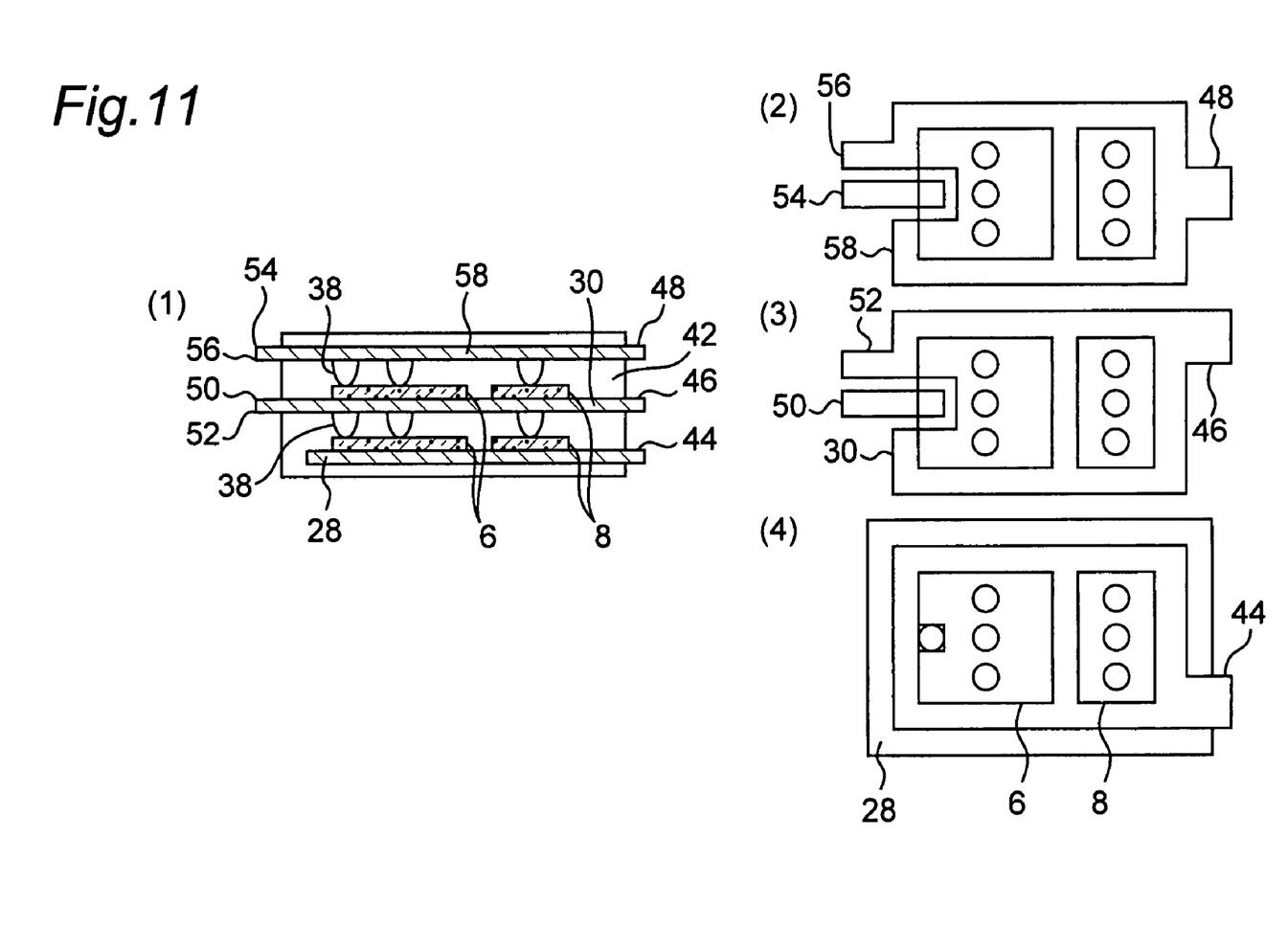
FIG. 11 shows a power semiconductor device according to the eighth embodiment of the present invention.
Figure 12:
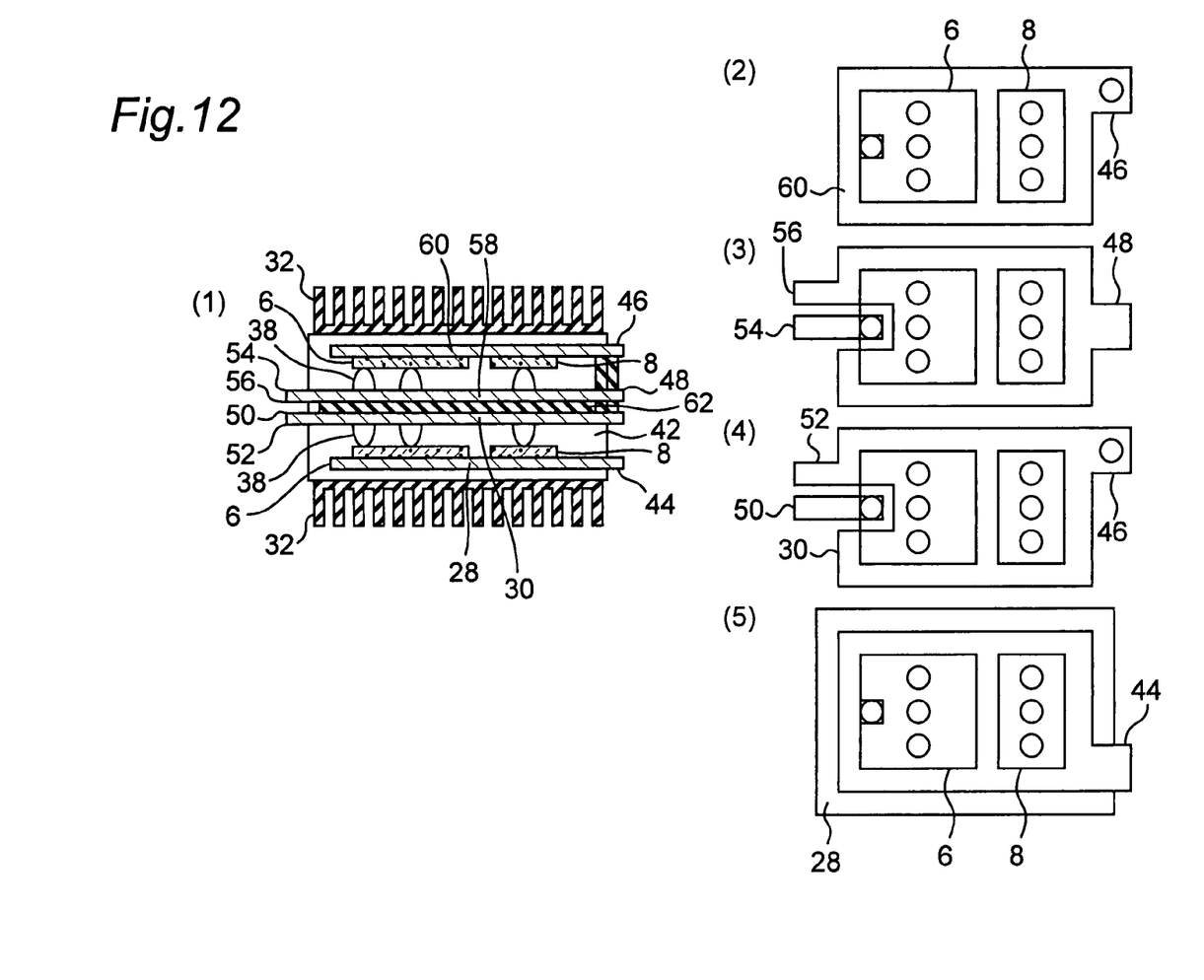
FIG. 12 shows another power semiconductor device according to the eighth embodiment of the present invention.

FIGS. 11 and 12 show power semiconductor devices according to Embodiment 8 of the present invention. FIG. 11 consists of FIGS. 11(1) to 11(4), wherein FIG. 11(1) shows a longitudinal sectional view of the device; FIG. 11(2), a bottom view of a third lead frame; FIG. 11(3), a top plan view of a second lead frame; and FIG. 11(4), a top plan view of a first lead frame. FIG. 12 consists of FIGS. 12(1) to 12(5), wherein FIG. 12(1) shows a longitudinal sectional view of the device; FIG. 12(2), a bottom view of a fourth lead frame; FIG. 12(3), a top plan view of a third lead frame; FIG. 12(4), a bottom view of a second lead frame; and FIG. 12(5), a top plan view of a first lead frame.

The power semiconductor devices shown in FIGS. 11 and 12 are provided by applying any of Embodiment 1 to 7, and at least three lead frames (or insulating substrates), but not two lead frames, are used in either of these embodiments. The devices also include mold resin (42), main current terminals (44, 46, 48), signal terminals (50, 52, 54, 56), third lead frame (58), fourth lead frame (60), and insulating plate (62).

In a conventional power semiconductor device, when the number of elements to be mounted is increased, the area for mounting them is unavoidably spread in two dimensional directions on a plane, so that the area of such plane portions is increased in proportion to the number of the elements. By contrast, in this embodiment, the components can be disposed in three dimensional directions, and thus, the area of the plane portions of the device can be largely decreased. In this regard, it is considered that the height of the device becomes higher in inverse proportion to the decreased area. However, since a considerable height is required for wire connection in the conventional device, the height of the device of this embodiment is not so largely increased as compared with the height of the conventional device.

This embodiment makes it possible to not only reduce the plane area and the circuit resistance, but also provide the following effect. In case where this embodiment of the present invention comprises an inverter circuit, it is possible to form one arm, using three lead frames, and thus, a separate common electric potential portion is not needed. Further, the inductance is decreased by lamination, and thereby, a surge in current or voltage can be effectively prevented.

Especially in the device shown in FIG. 11, the main current paths oppose to each other, and thus, the inductance can be decreased. In the device shown in FIG. 12, the elements are disposed in the vicinity of the heat radiating portions, and thus, heat can be effectively radiated from the device.

What is claimed is:

1. A power semiconductor device comprising a switching power semiconductor element, and a free wheeling diode in anti-parallel connection to the switching power semiconductor element, characterized in that:
    a reverse electrode of the switching power semiconductor element and a reverse electrode of the free wheeling diode are bonded and mounted on a circuit pattern formed on a main surface of the first substrate;
    a circuit pattern, which is so formed on a main surface of the second substrate as to oppose a surface electrode of the switching power semiconductor element and a surface electrode of the free wheeling diode, is connected to the surface electrodes of the switching power semiconductor element and the free wheeling diode through connective conductors to be soldered, respectively, at least the contacting surfaces of the connective conductors each having a curved surface which directly contacts the circuit pattern or the surface electrode;
    a first string-like partitioning material is a U-shaped partitioning material laid in the vicinity of and alongside the outer peripheral edges of the first substrate and the second substrate, and is bonded to the first substrate and the second substrate;
    a gel-like insulation and heat resistant filler is inserted from an opening of said U-shaped partitioning material or is inserted using a syringe from the bases of the three sides of said U-shaped partitioning material; and
    a second partitioning material is disposed on said opening and is bonded to the first substrate and the second substrate to thereby seal and confine the insulation and heat resistant filler.

2. A power semiconductor device according to claim 1, wherein an IC for controlling the driving of the switching power semiconductor element is mounted on the reverse of the second substrate, the surface of which is opposed to the first substrate.

3. A power semiconductor device according to claims 1, wherein at least the first substrate is a ceramic insulating substrate, and a heat sink divided into a plurality of portions is bonded to the reverse of the ceramic substrate.

4. A power semiconductor device according to claims 1, wherein at least the first substrate is a ceramic insulating substrate, and a portion so shaped as to function as a heat sink is formed on the reverse of the ceramic substrate.

5. A power semiconductor device according to claims 1, wherein, when one end of an external lead is soldered to the substrate, all of such soldering is made on the circuit pattern formed on the main surface of the first substrate.

6. A power semiconductor device according to claim 1, wherein the connective conductors are flexible enough to absorb stress.

7. A power semiconductor device according to claims 1, wherein at least three substrates are comprised.

* * * * *